(12) United States Patent
Miyazaki et al.

(10) Patent No.: US 6,903,637 B2
(45) Date of Patent: Jun. 7, 2005

(54) CONNECTING MEMBER, A MICRO-SWITCH, A METHOD FOR MANUFACTURING A CONNECTING MEMBER, AND A METHOD FOR MANUFACTURING A MICRO-SWITCH

(75) Inventors: Masaru Miyazaki, Tokyo (JP); Hirokazu Sampei, Tokyo (JP); Yongxun Liu, Ibaraki (JP); Masayoshi Esashi, Miyagi (JP)

(73) Assignee: Advantest Corporation, Tokyo (JP)

( * ) Notice: Subject to any disclaimer, the term of this patent is extended or adjusted under 35 U.S.C. 154(b) by 25 days.

(21) Appl. No.: 10/329,636

(22) Filed: Dec. 26, 2002

(65) Prior Publication Data

US 2003/0093895 A1 May 22, 2003

Related U.S. Application Data

(63) Continuation of application No. PCT/JP02/04116, filed on Apr. 25, 2002.

(30) Foreign Application Priority Data

Apr. 26, 2001 (JP) ........................................ 2001-130398

(51) Int. Cl.[7] .............................................. H01H 51/22
(52) U.S. Cl. ............................ 335/78; 335/83; 200/181
(58) Field of Search ............. 335/78–86; 361/233–234; 200/181; 257/414–427

(56) References Cited

U.S. PATENT DOCUMENTS

| | | | |
|---|---|---|---|
| 5,086,337 A | 2/1992 | Noro et al. | |
| 5,463,233 A | * 10/1995 | Norling | ........................ 257/254 |
| 5,723,894 A | 3/1998 | Ueno et al. | |
| 6,218,736 B1 | 4/2001 | Yagi et al. | |
| 6,384,353 B1 | * 5/2002 | Huang et al. | ................ 200/181 |
| 2004/0066258 A1 | * 4/2004 | Cohn et al. | .................... 335/78 |

FOREIGN PATENT DOCUMENTS

| | | |
|---|---|---|
| EP | 1 014 094 A1 | 6/2000 |
| JP | 63-133541 | 6/1988 |
| JP | 7-14483 | 1/1995 |
| JP | 11-176306 | 7/1999 |
| JP | 2001-76599 | 3/2001 |
| JP | 2001-76605 | 3/2001 |

OTHER PUBLICATIONS

ISA/Japanese Patent Office, PCT International Search Report for PCT/JP02/04116, Aug. 20, 2002, 2 pages.

* cited by examiner

*Primary Examiner*—Lincoln Donovan
(74) *Attorney, Agent, or Firm*—Osha & May L.L.P.

(57) ABSTRACT

The micro-switch couples electrically a first terminal to a second terminal. The micro-switch includes: a first supporting member where the first terminal is provided; a moving unit where the second terminal corresponding to the first terminal is provided; a driving unit for bringing the second terminal into contact with the first terminal by driving the moving unit in a direction of the first terminal by supplying power; an electrode provided in the first supporting member, and for supplying power to the driving unit; an elastic terminal including the elastic unit having elasticity in a predetermined direction; and a pushing terminal contacting the elastic terminal by pushing the elastic unit, the pushing terminal being electrically coupled to the electrode.

21 Claims, 11 Drawing Sheets

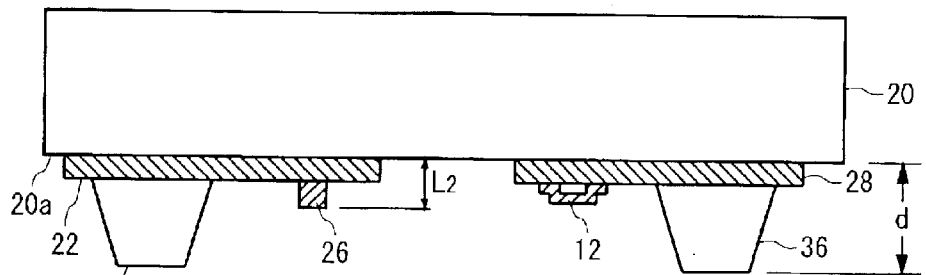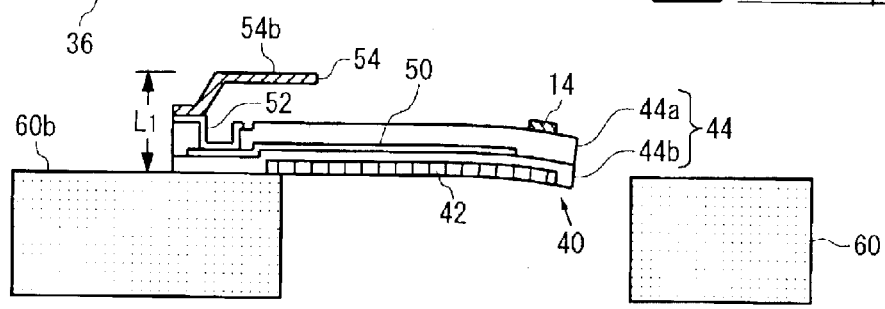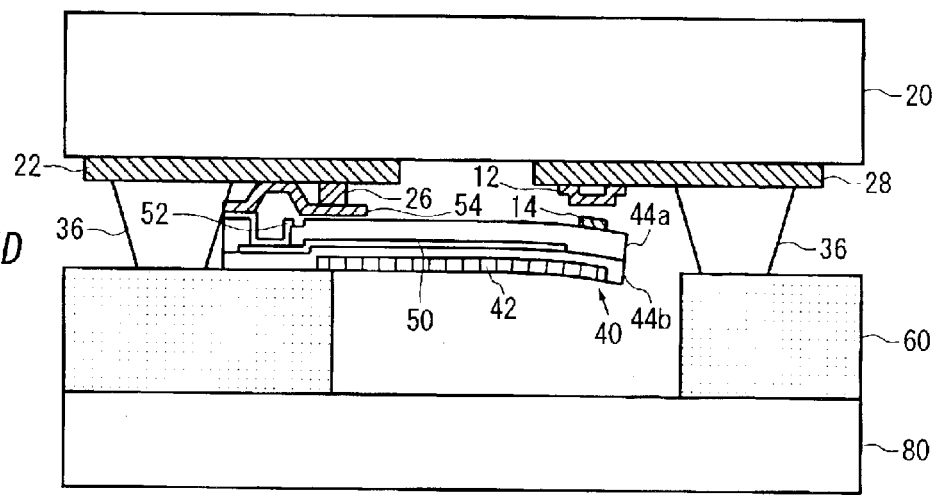

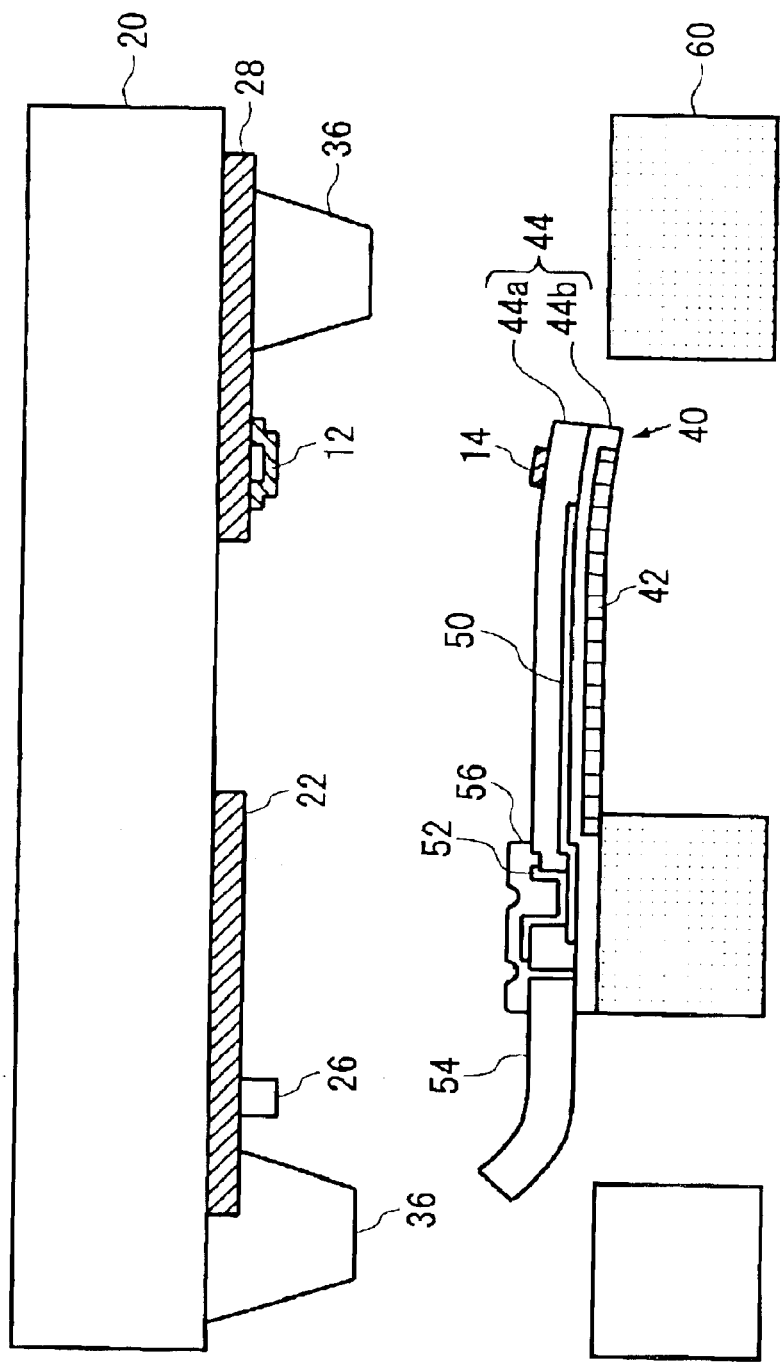

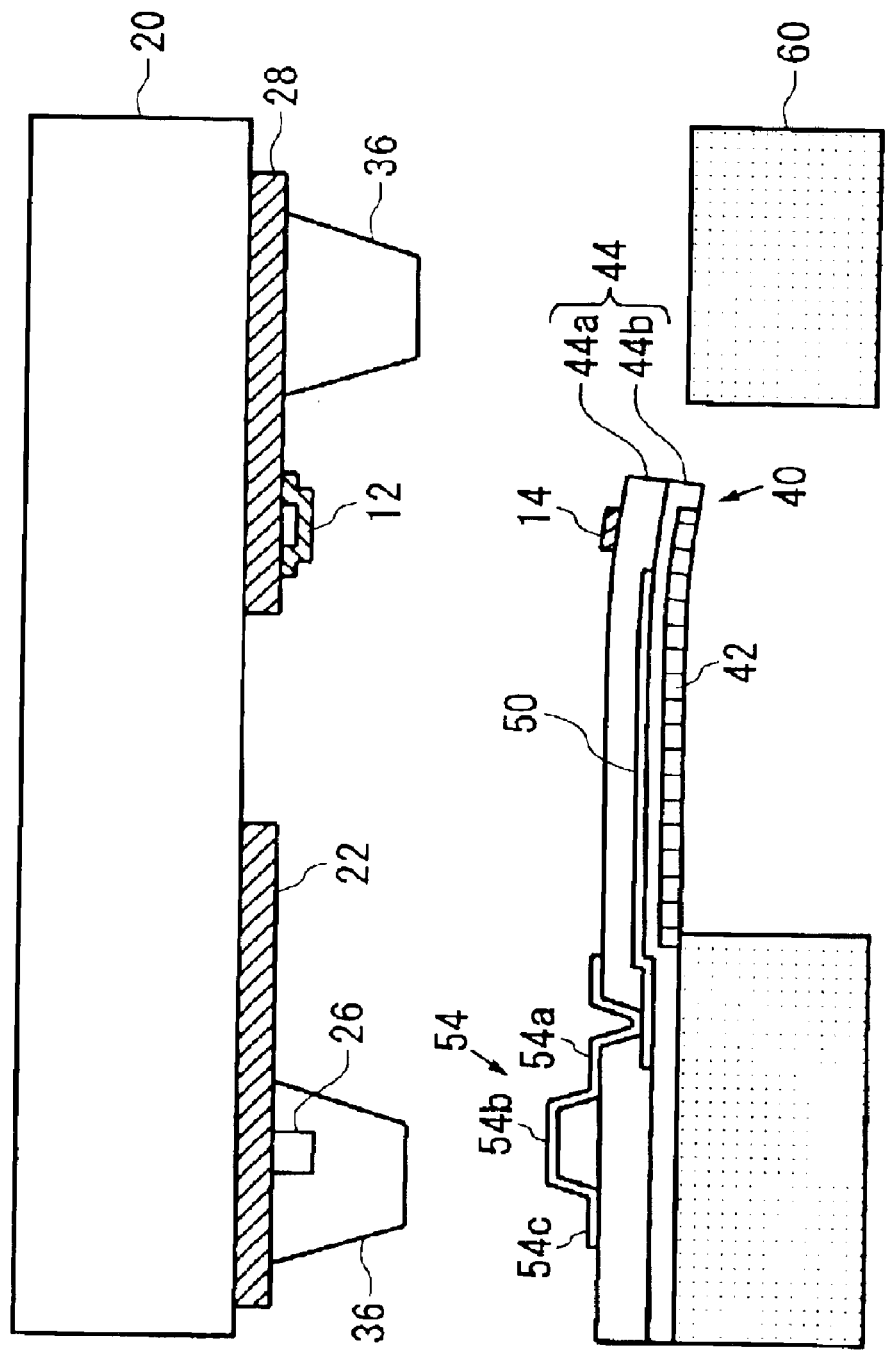

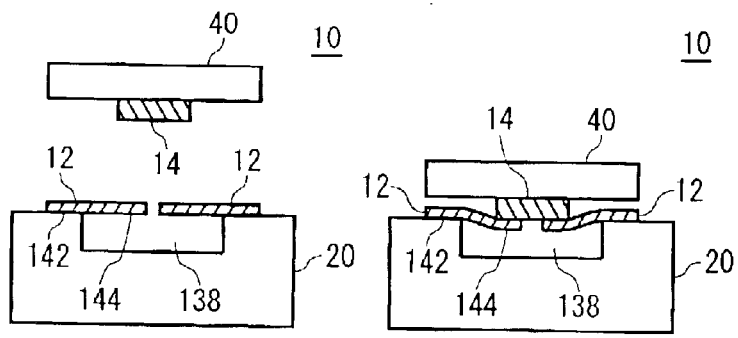
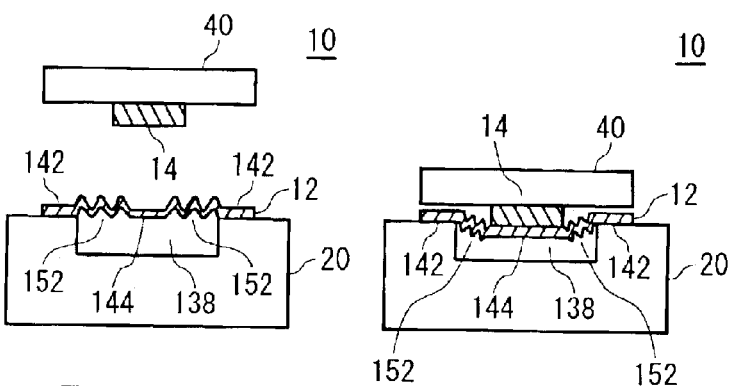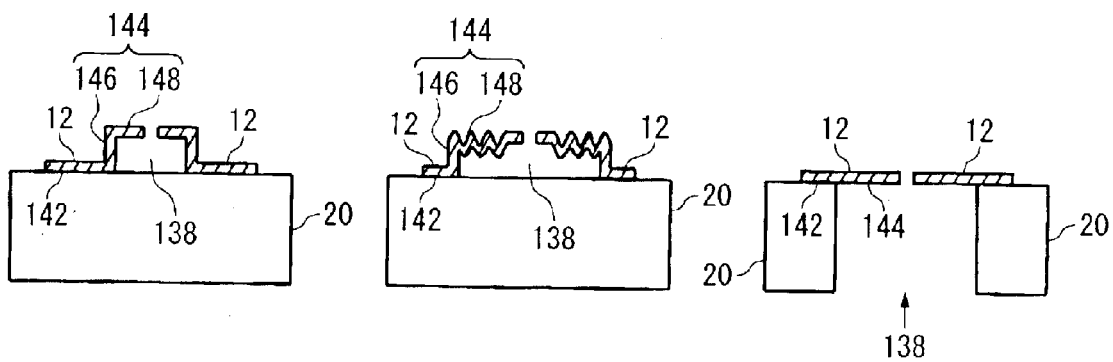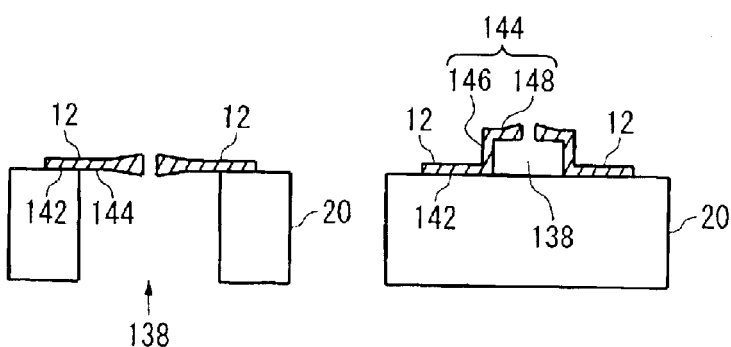

CONNECTING MEMBER, A MICRO-SWITCH, A METHOD FOR MANUFACTURING A CONNECTING MEMBER, AND A METHOD FOR MANUFACTURING A MICRO-SWITCH

The present application is a continuation application of PCT/JP02/04116 filed on Apr. 25, 2002 which claims priority from Japanese Patent Application No. 2001-130398 filed on Apr. 26, 2001, the contents of which are enclosed herein by reference.

BACKGROUND OF THE INVENTION

1. Field of the Invention

The present invention relates to a connecting member, a micro-switch, a method for manufacturing a connecting member, and a method for manufacturing a micro-switch. More particularly, the present invention relates to a connecting member and a micro-switch used for a micro-machine formed by joining a plurality of substrates. This patent application also relates to a Japanese patent application No. 2001-130398 filed on Apr. 26, 2001, the contents of which are incorporated herein by reference.

2. Description of Related Art

In manufacture of a micro-machine, a technique for joining a silicon substrate to another silicon substrate or a glass substrate is used in order to make a complexly shaped device. A minute device with a complex structure can be manufactured by joining a plurality of substrates processed minutely. An example of these micro-machines is a capacitive pressure sensor, etc. manufactured by processing a silicon substrate and a glass substrate, respectively, and joining them together, forming a cavity, etc. inside. According to the conventional methods, electric wiring line installed on each substrate is connected by taking it out from junction surface.

In the conventional methods, however, there is a problem that a micro-machine cannot be sealed definitely because of gaps on the junction surface.

The present invention is made for the purpose of providing a connecting member, a micro-switch, a method for manufacturing a connecting member, and a method for manufacturing a micro-switch, which can solve the aforementioned problem.

The above and other objects can be achieved by combinations described in the independent claims. The dependent claims define further advantageous and exemplary combinations of the present invention.

SUMMARY OF THE INVENTION

Namely, according to the first aspect of the present invention, there is provided a micro-switch which is a connecting member for electrically coupling a first unit installed in a first supporting member to a second unit installed in a second supporting member, including: a junction unit joined to said first unit; an elastic terminal including an elastic unit have elasticity in a predetermined direction; and a pushing terminal contacting said elastic unit by pushing said elastic unit as soon as being electrically joined to said second unit. The elastic unit may be formed, projecting toward the direction of the pushing terminal.

According to the second aspect of the present invention, there is provided a micro-switch for electrically coupling a first terminal to a second terminal, including: a first supporting member where said first terminal is installed; a moving unit where said second terminal corresponding to said first terminal is installed; a driving unit for bringing said second terminal into contact with said first terminal by driving said moving unit in the direction of said first terminal by means of supplying power; an electrode installed in said first supporting member, for supplying power to said driving unit; a first junction unit joined to either said driving unit or said electrode, an elastic terminal including an elastic unit having elasticity in a predetermined direction; and a pushing terminal contacting said elastic terminal by pushing said elastic unit as soon as being electrically joined to either said driving unit or said electrode.

Herein, to be joined to one of the driving unit and the electrode is a state to be electrically connected to the driving unit and the electrode, and says to be in a fixed position with regard to the driving unit or the electrode. Similarly, to be joined to the other of the driving unit and the electrode is a state to be electrically connected to the driving unit and the electrode, and says to be in a fixed position with regard to the driving unit or the electrode. In addition, the micro-switch has a driving wiring line electrically connected to the driving unit, and thus the first junction unit of the elastic terminal may be connected to the driving wiring line.

The micro-switch may further include a second supporting member supporting the driving unit and being joined to said first supporting member. The elastic terminal may further include a second junction unit with putting the elastic unit between the first junction unit and the second junction unit.

The moving unit may have a plurality of members having different thermal expansion ratios. The driving unit may have a heater for heating said moving unit. The first and second supporting members may be joined together by anode junction. The first and second supporting members may be joined together by metal junction, such as moldering, Au—Au(gold), and etc. The elastic unit may be stuck to said pushing terminal.

The first supporting member may be formed with a glass substrate but the second supporting member may be formed with a silicon substrate. The micro-switch may have, on one of the first and second supporting members, a projecting unit projecting toward the direction of the other of said first and second supporting members, and for forming space accepting the moving unit and the second terminal between the first and second supporting members.

It is desirable thickness of the projecting unit in the predetermined direction is smaller than sum of distance from a surface, where the projecting unit is installed, of one of the first and second supporting members till a surface contacting the elastic unit of the pushing terminal or a surface contacting the pushing terminal of the elastic unit, respectively, and distance from one of the first and second supporting members till a surface contacting the elastic unit of the pushing terminal or a surface contacting the pushing terminal of the elastic unit.

The micro-switch may further include a third terminal corresponding to the second terminal, and the second terminal may couple the first terminal to the third terminal electrically by being brought into contact with the first terminal and the third terminal. The micro-switch may include a plurality of the elastic terminals and a plurality of the pushing terminals corresponding to the plurality of said elastic terminal, respectively.

The micro-switch may further include a power source for supplying power to said driving unit, the first supporting member may include a penetrating hole penetrating from a junction surface joined to the second supporting member to a opposite surface to the junction surface, and the electrode may include a conductive member for filling in the penetrating hole thus couples the power source to the driving unit electrically via the conductive member. In addition, it is desirable the first terminal includes a fixed unit fixed to the first supporting member and a facing unit which is formed by being extended from the fixed unit and corresponded to the first supporting member with putting air gap therebetween.

According to the third aspect of the present invention, there is provided a connecting member manufacturing method for electrically coupling a first unit installed in a first substrate to a second unit installed in a second substrate, including steps of: forming on a first substrate an elastic terminal having a junction unit joined to the first unit and an elastic unit having elasticity in a determined direction; forming on a second substrate a pushing terminal pushing the elastic unit in a determined direction as soon as being joined to the second unit; and joining the first substrate and the second substrate together in order that the pushing terminal is brought into contact with the elastic unit by pushing down the elastic unit.

According to the third aspect of the present invention, there is provided a micro-switch manufacturing method for electrically coupling a first terminal to a second terminal, including steps of: forming the first terminal on a first substrate; forming a moving unit, where the second terminal is installed, on a second substrate; forming on the second substrate a driving unit which brings the second terminal into contact with the first terminal by driving the moving unit in the direction of the first terminal by means of supplying power; a step forming on the second substrate a junction unit joined to the driving unit and an elastic terminal having an elastic unit having elasticity in a predetermined direction;

a step forming on the first substrate an electrode for supplying power to the driving unit; a step forming a pushing unit joined to the electrode on the first substrate; and a step joining together the first substrate and the second substrate in order that the first terminal is corresponded to the second terminal as soon as the pushing unit is brought into contact with the elastic unit by pushing the elastic unit in a determined direction.

The driving unit forming step may further include a step forming a wiring line electrically connected to the driving unit, and thus the elastic terminal forming step may include: a step forming a first photoresist layer on the upper layer of the second substrate with exposing at least unitarily the wiring line; a step forming a plating layer laid across from a portion of the wiring line to the first photoresist layer; and a step removing the first photoresist layer.

The elastic terminal forming step may further include: a step forming a plating base layer on the upper layer of the second substrate in order to cover a portion of the wiring line and the first photoresist layer; a step forming a second photoresist layer on the upper layer of the second substrate with exposing a portion of the wiring line and the plating base layer formed on the first photoresist layer; a step forming the plating layer on the second photoresist layer; a step removing the second photoresist layer; and a step removing the plating base layer.

The micro-switch manufacturing method may further include a step forming, on one of the first substrate and the second substrate, a projecting unit projecting toward the direction of the other of the first substrate and the second substrate, and for forming space accepting the moving unit and the second terminal between the first substrate and the second substrate; and thus the first photoresist layer forming step may form the first photoresist layer such that thickness of the projecting unit is smaller than sum of distance from a surface, where the projecting unit is installed, of one of the first substrate and the second substrate till a surface contacting the elastic unit of the pushing terminal or a surface contacting the pushing terminal of the elastic unit, respectively, and distance from one of the first substrate and the second substrate till a surface contacting the elastic unit of the pushing terminal or a surface contacting the pushing terminal of the elastic unit. It is desirable the projecting unit is formed to seal space accepting the moving unit and the second terminal.

The micro-switch manufacturing method may further include a step forming, on one of the first substrate and the second substrate, a projecting unit projecting toward the direction of the other of the first substrate and the second, and for forming space accepting the moving unit and the second terminal between the first substrate and the second substrate. It is desirable the projecting unit is formed to seal space accepting the moving unit and the second terminal.

According to the fifth aspect of the present invention, there is provided a micro-switch for electrically coupling a first terminal to a second terminal, and the micro-switch includes: a first supporting member where the first terminal is installed; and a moving unit where the second terminal corresponding to the first terminal is installed, and thus the first terminal includes: a fixed unit fixed to the first supporting member; and a displacing unit formed by being extended from the fixed unit and being displaced elastically in the direction of pushing when pushed down by the second terminal.

The first substrate may include a ditch unit having an opening on a surface corresponding to said moving unit; the fixed unit is formed in the vicinity of the ditch unit on a surface corresponding to the moving unit of the first substrate; and thus the displacing unit may be formed by being extended from rim of the opening of the ditch unit to inside of the opening.

The displacing unit may be formed by being extended from the extending unit almost parallel to a surface corresponding to a bimorph unit of the substrate, and thus be brought into contact with the second contacting point. The displacing unit may include a call gate unit having a call gate structure.

The summary of the invention does not necessarily describe all necessary features of the present invention. The present invention may also be a sub-combination of the features described above.

BRIEF DESCRIPTION OF THE DRAWINGS

FIGS. 4A through 4D are cross-sectional views showing a micro-switch according to a second embodiment of the present aspect of the present invention.

FIGS. 6A and 6B are cross-sectional views showing a micro-switch according to a forth embodiment of the present aspect of the present invention.

FIGS. 7A and 7B are cross-sectional views showing a micro-switch according to a fifth embodiment of the present aspect of the present invention.

FIGS. 11A through 11I show diagrams for explaining operation of a micro-switch 10 according to the present invention. Specifically, FIG. 11A is a cross-sectional view showing a micro-switch 10 in case a moving unit 40 supports a second terminal 14 which is not in contact with a first terminal 12; FIG. 11B is a diagram showing the micro-switch 10 in case the moving unit 40 brings the second terminal 14 into contact with the first terminal 12; FIG. 11C is a diagram showing the micro-switch 10 in case the moving unit 40 supports the second terminal 14 which is not in contact with the first terminal 12; FIG. 11D is a diagram showing the micro-switch 10 in case the moving unit 40 brings the second terminal 14 into contact with the first terminal 12; FIG. 11E is a diagram showing another example of the first terminal 12 according to the present invention; FIG. 11F is a diagram showing another example of the first terminal 12 according to the present invention; FIG. 11G is a diagram showing another example of the first terminal 12 according to the present invention; FIG. 11H is a diagram showing another example of the first terminal 12 according to the present invention; and FIG. 11I is a diagram showing another example of the first terminal 12 according to the present invention.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1A:
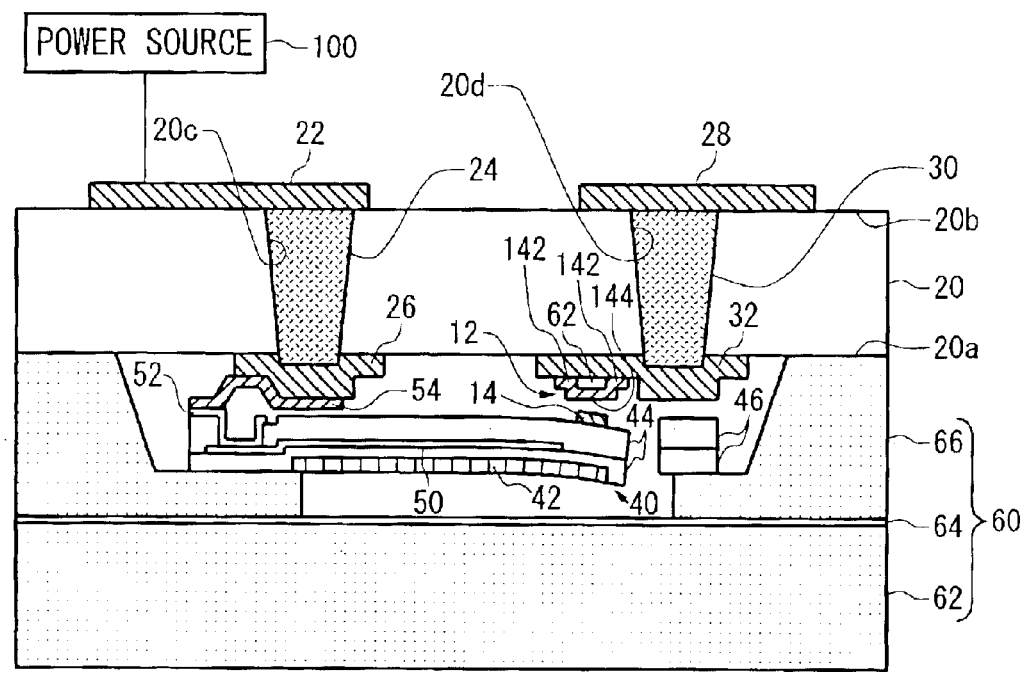
FIGS. 1A and 1B are cross-sectional views showing a micro-switch according to a first embodiment of a first aspect of the present invention.
Figure 1B:
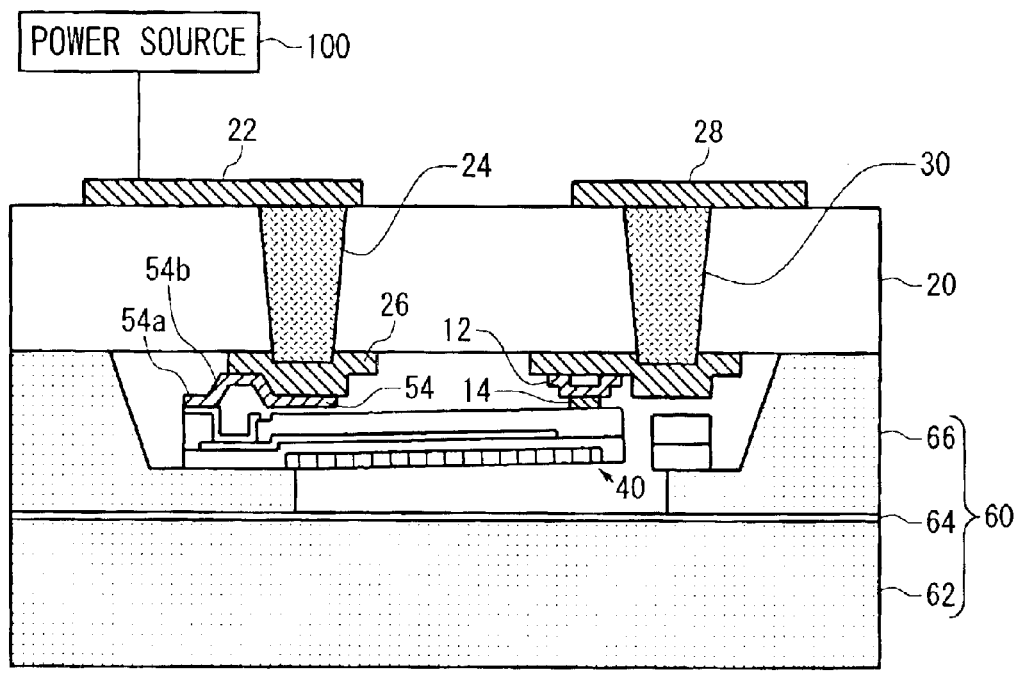

FIGS. 1A and 1B are cross-sectional views showing a micro-switch according to a first embodiment of a first aspect of the present invention. Specifically, FIG. 1A is a cross-sectional view showing the micro-switch in an "off" state, and FIG. 1B is a cross-sectional view showing the micro-switch in an "on" state.

The micro-switch 10 includes: a first terminal 12 and a third terminal (not shown); a first supporting member 20 where the first terminal 12 and the third terminal are installed; a second terminal 14 corresponding to the first terminal 12 and the third terminal; a moving unit 40 of which the second terminal 14 is installed at an end; a driving unit 50 for driving the moving unit 40 in the direction of the first terminal 12 by means of supplying power and bringing the second terminal 14 into contact with the first terminal and the third terminal; a second supporting member 40 for supporting the moving unit 40 by being joined to the first supporting member 20.

The second supporting member 60 includes a first silicon layer 62, a silicon dioxide layer 64 formed on the first silicon layer 62, and a second silicon layer 66 formed on the silicon dioxide layer 64. The moving unit 40 and the driving unit 50 are formed on the second silicon layer 66. The driving unit 50 includes a driving wiring line 52 exposed at or proximate a different end from an end at which the second terminal 14 of the moving unit 40 is installed. The micro-switch 10 further includes an elastic terminal 54 having a joining unit 54a and an elastic unit 54b having elasticity in a predetermined direction. In the present aspect of the present invention, the elastic unit 54b of the elastic terminal 54 are installed, projecting out toward the direction of the first supporting member 20.

The first supporting member 20 includes a first penetrating hole 20c and a second penetrating hole 20d, which are penetrating from a junction surface 20a joined to the second supporting member 60 to an opposite surface 20b to the joining surface 20a. The micro-switch 10 further includes a driving electrode 22 formed to fill in the first penetrating hole 20c at the opposite surface 20b for supplying power to the driving unit 50, and a signal electrode 28 formed to fill in the second penetrating hole 20d at the opposite surface 20b for supplying electrical signals to the driving unit 50. In addition, the driving electrode 22 has a first conductive member 24 which fills in the first penetrating hole 20c. The micro-switch 10 further includes a pushing terminal 26 contacting the elastic unit 54b, pushing down the elastic unit 54b of the elastic terminal 54 as soon as joined to the first conductive member 24. In addition, the signal electrode 28 has a second conductive member 30 which fills in the second penetrating hole 20d and a third conductive member 32 joined to the second conductive member 30 on the junction surface 20a. In the present aspect of the present invention, the first supporting member may be formed with a glass substrate.

The first terminal 12 is formed on the third conductive member 32. The first terminal 12 is corresponded to the first supporting member, putting the third conductive member 32 therebetween. In the present aspect of the present invention, the first terminal 12 has a fixed unit 142 and a displacing unit 144. The fixed unit 142 is fixed to the third conductive member 32 so that it is fixed to the first supporting member 20. The displacing unit 144 is an example of a facing unit which is formed to be extended from the fixed unit 142 and is corresponded to the first supporting member, putting air gap 62 therebetween. The displacing unit 144 is displaced elastically in the direction of pushing when it is pushed down by the second terminal 14, and thus the second terminal 14 can be coupled to the first terminal 12 electrically. Further, the displacing unit 144 may include an elastic unit having elasticity in the direction pushing. Above, the third terminal may have the same or the same kind of function as the first terminal 12's.

Besides, the pushing terminal 26 may have an elastic unit having elasticity in a predetermined direction. In addition, in the present aspect of the present invention, to have elasticity includes a feature to be pushed down and thus transformed by other terminals. The elastic unit 54b of the elastic terminal 54 may be divided into several parts. If the elastic unit 54b is divided into several parts, each of the divided elastic unit 54b's has a different distance to project out in the direction of the first supporting member 30. In this case, the pushing terminal 26 contacts an elastic unit 54b projecting out the farthest so that it can be electrically connected to the elastic terminal 54 definitely.

It is desirable that the micro-switch 10 further includes a power source 100 for supplying power to the driving unit 50.

The power source 100 supplies current to the driving unit 50, being connected to the driving electrode 22.

It is desirable that the moving unit 40 has a plurality of members having different thermal expansion ratios. A plurality of members having different thermal expansion ratios may be a plurality of metals having different thermal expansion ratios. The moving unit 40 is formed by filing up a plurality of members having different thermal expansion ratios, and thus shape of the moving unit 40 is transformed by difference of thermal expansion ratio of each member when each member is heated. In the aspect of the present invention, when the driving unit 50 doesn't drive the moving unit 40 in the direction of the first terminal 12 and the third terminal, the moving unit 40 is installed to lean toward the opposite direction to that of the first terminal 12 and the third terminal so that the second terminal 14 doesn't contact the first terminal 12 and the third terminal.

The moving unit 40 has a first forming member 42 and a second forming member 44. It is desirable the first forming member 42 is formed with a material having greater thermal expansion ratio than one of a material forming the second forming member 44. It is desirable that the first forming member 42 is formed with a material of relatively great thermal expansion ratio, such as aluminum, nickel, nickel-steel, paradium-copper silicon, resin, and etc. It is desirable that the second forming member 44 is formed with a material of small thermal expansion ratio, such as silicon dioxide, silicon nitride, silicon, aluminum oxide, and etc. In the present aspect of the present invention, the second forming member 44 is formed on a second layer in order to put the driving unit 50 therebetween. It is desirable that the driving unit 50 is a means for driving the second terminal 14 in the direction of the first terminal 12 and the third terminal by supplying power. The driving unit 50 may drive the second terminal 14 in the direction of the first terminal 12 and the third terminal by supplying energy. In the present embodiment, the driving unit 50 has a heater for heating the moving unit 40 having a plurality of members having different thermal expansion ratios.

The moving unit 50 heats the first forming member 42 and the second forming member 44. It is desirable that the driving unit 50 is installed at a portion different from where the second terminal 14 is installed. It is desirable that the driving unit 50 is formed with a material for emitting heat by being supplied current. In addition, it is desirable that the driving unit 50 is formed with a material of which its thermal expansion ratio is between that of the second forming member 44 and that of the first forming member 42. In the present aspect of the present invention, the driving unit 50 is formed with a metal resistance material, such as nickel-chrome alloy, metal laminated layer laminated by chrome and platinum, and etc.

In another example, the driving 50, as an implement for driving the moving unit, may have an infrared irradiating means not arranged in the moving unit 40 and etc. In this case, the driving unit 50 may heat the moving unit 40 by means of the infrared irradiating means. In addition, in yet another example, the driving unit 50 may have a temperature controllable chamber. In this case, the driving unit 50 may heat the moving unit 40 by means of controlling the chamber temperature.

The moving unit 40 may further have a member having different thermal expansion ratio from one of a material forming the first forming member 42 and the second forming member 44 between the first forming member and the second forming member in order to control driving amount caused by the driving unit 50 of the moving unit 40.

It is desirable that in case the first forming member 42 or the second forming member 44 are formed with a material having conductivity, the moving unit 40 further has an insulating member for insulating the driving unit 50 from the first forming member 42 and the second forming member 44. For instance, the insulating member may be an insulation material like silicon dioxide.

In the present aspect of the present invention, the first supporting member 20 and the second supporting member 60 are joined together by anode junction. In addition, the first supporting member 20 and the second supporting member 60 may be joined together by metal junction like Au—Au and etc. In another example, the first supporting member 20 and the second supporting member 60 may be joined together by soldering. The elastic unit 54b of the elastic terminal 54 may be stuck to the pushing terminal 26. It is desirable that the first supporting member 20 and the second supporting member 60 are joined together, sealing space enclosing the moving unit 40.

In the present aspect of the present invention, the micro switch 10 has the elastic terminal 54 having the joining unit 54a and the elastic unit 54b and the pushing terminal 26 contacting the elastic unit 54b by pushing down the elastic unit 54b of the elastic terminal 54, and thus when the first supporting member 20 and the second supporting member 60 are joined together, the elastic terminal 54 and the pushing terminal 26 can be joined together so that electric connection between the first supporting member 20 and the second supporting member 60 can be carried out easily.

Figures 2A, 2B:
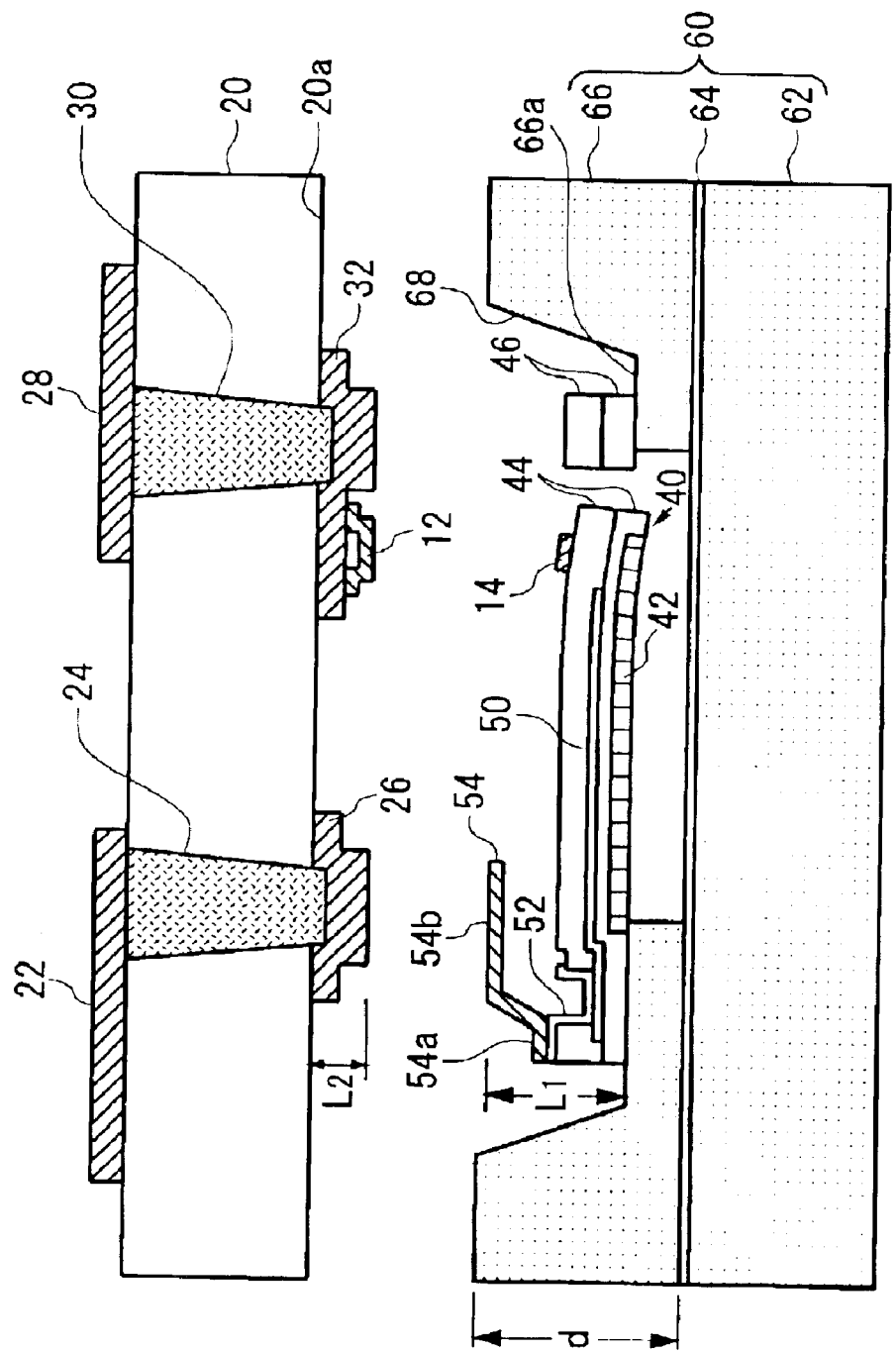
FIGS. 2A and 2B are cross-sectional views showing a micro-switch before a first and a second supporting members are joined together.

FIG. 2 is a cross-sectional view showing the micro-switch before the first and second supporting members are joined together. FIG. 2A is a cross-sectional view of the first supporting member 20 where the first terminal 12 is formed. FIG. 2B is a cross-sectional view of the second supporting member 60 where the second terminal 14 is formed.

As shown in FIG. 2B, In the present aspect of the present invention, the second supporting member 60 has a projecting unit 68 projecting toward the direction of the first supporting member 20, and which forms space accepting the moving unit 40, the driving unit 50, and the second terminal 14 between the first supporting member 20 and the second supporting member 60. Thickness d of the projecting unit 68 in a predetermined direction is smaller than sum of distance L1 from surface 66a, where the projecting unit 68 of the second supporting member 60 is installed, till a surface contacting the pushing terminal 26 of the elastic unit 54b and distance L2 from the junction surface 20a of the first supporting member 20 till a surface contacting the elastic unit 54b of the pushing terminal 26.

In the present aspect of the present invention, thickness d of the projecting unit 68 is formed to be smaller than sum of distance L1 and distance L2, therefore when the first supporting member 20 and the second supporting member 60 are joined together, the pushing terminal 26 pushes down the elastic unit 54b so that the pushing terminal 26 can be brought into contact with the elastic unit 54b definitely. Therefore, the pushing terminal 26 can be coupled to the elastic unit 54b electrically with low contact resistance.

Figure 3A:
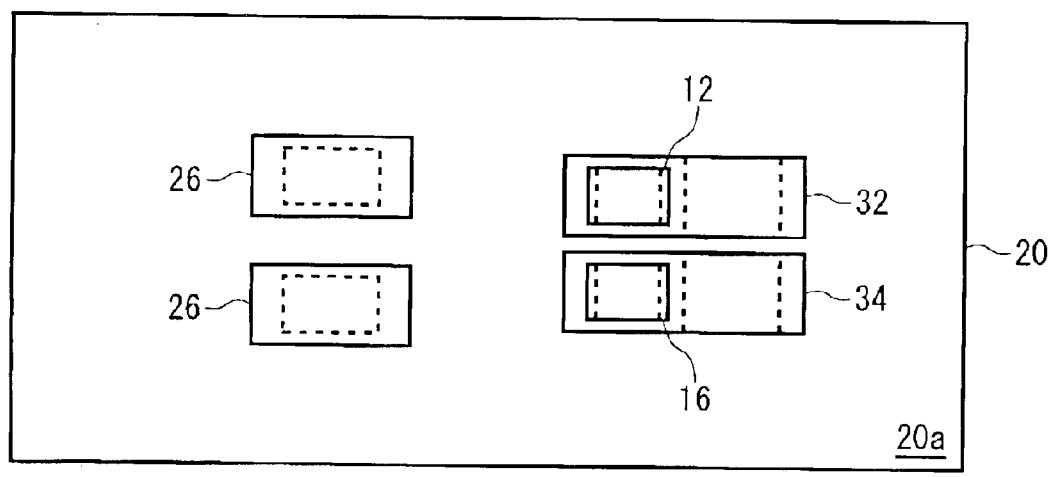
FIGS. 3A and 3B are plane views showing the first and second supporting members shown in FIGS. 2A and 2B.

FIG. 3 is a plane view showing the first and second supporting members shown in FIG. 2. FIG. 3A is a plane-view viewing the first supporting member from the second supporting member 60 and the junction surface 20a. The micro-switch 10 includes on the junction surface 20a of the first supporting member 20, the first terminal corresponding to the second terminal 14, a third conductive member 32 for electrically connecting the third terminal 16 and the first terminal 12 to the signal electrode 28, and a forth conductive member 34 for electrically connecting the third electrode 16 to outside. The second terminal 14 electrically couples the first terminal 12 to the third terminal 16, contacting the first terminal 12 and the third terminal 16. In the present aspect of the present invention, the micro-switch 10 has a plurality of pushing terminal 26's on the junction surface 20a of the first supporting member 20.

Figure 3B:
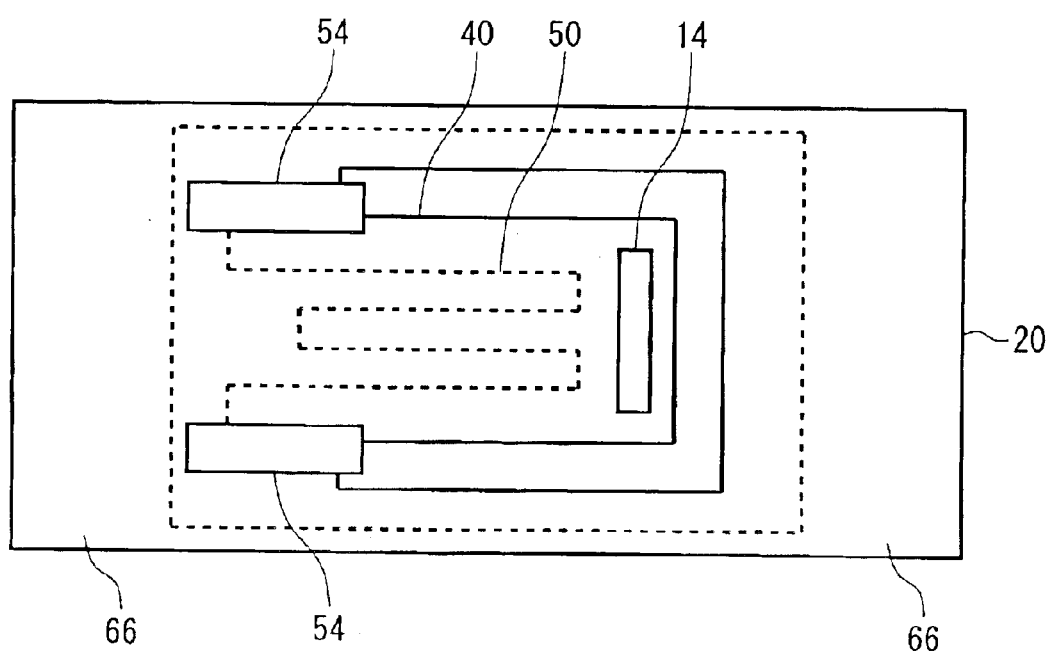

FIG. 3B is a plane-view viewing the second supporting member 60 shown in FIG. 1 from the junction surface joined to the first supporting member 20. The micro-switch 10 has a plurality of elastic terminal 54's corresponding to the second terminal 14, the moving unit 40, the driving unit 50, and a plurality of pushing terminal 26's, respectively. The projecting unit 68 being laid across 4 and lines enclosing the moving unit 40 in FIG. 2 is formed on the second silicon layer of the second supporting member 60. The second supporting member 60 has the projecting unit 68, and thus space enclosing the moving unit 40 of the micro-switch 10 can be sealed definitely by joining the second supporting member 60 to the first supporting member 20.

In the present aspect of the present invention, the micro-switch 10 has a plurality of elastic terminal 54's and a plurality of pushing terminal 20's corresponding to a plurality of elastic terminal 54's, and thus when the first supporting member 20 and the second supporting member 60 are joined together, each terminal of the first supporting member 20 can be coupled to each terminal of the second supporting member 60 electrically.

Next, there will be explained working of the micro-switch 10 with reference to FIG. 1 thru FIG. 3.

As shown in FIG. 1A, the second silicon layer 66 sustains the moving unit 40 in order to keep a predetermined gap from the second terminal 14 to the first terminal 12 and the third terminal. Herein, signals are supplied to the first terminal 12. When the micro-switch 10 is on, a power supplying means 100 supplies current to the driving unit 50 via the driving electrode 22. As the result, the first forming member 42 and the second forming member of the moving unit 40 are heated by the driving unit 50. The first forming member 42 and the second forming member 44 have different thermal expansion ratios, and thus the first forming member 42 extends further than the second forming member 44. As the result, as shown in FIG. 1B, the moving unit 40 is driven in the direction of the first supporting member 20. And, the second terminal 14 installed in the moving unit 40 is brought into contact with the first terminal 12 and the third terminal 16 so that the first terminal 12 is coupled to the third terminal 16 electrically. Therefore, signals supplied to the first terminal 12 are supplied to the third terminal 16 via the second terminal 14.

When the micro-switch 10 is off, the power supplying means 100 stops current being supplied to the driving unit 50. By this, the first forming member 42 and the second forming member 44 of the moving unit 40 return to original shapes so that the moving unit 40 moves in the opposite direction to the first supporting member 20. As the result, the second terminal 14 is separate from the first terminal 12 and the third terminal 16 so that signals supplied to the first terminal 12 is not supplied to the third terminal 16 any more.

Like the above, the elastic terminal 54 and the pushing terminal 26 contact each other when the first supporting member 20 and the second supporting member 60 are joined together, and thus the micro-switch 10 according to the present aspect of the present invention can electrically couple the first supporting member 20 to the second supporting member 60 easily.

FIG. 4 is a cross-sectional view showing the second embodiment of a micro-switch according to the present aspect of the present invention. In the present embodiment, the same symbols as those in FIG. 1 thru FIG. 3 are assigned to the same elements as those in the micro-switch of the first embodiment. FIG. 4A is a cross-sectional view of the first supporting member 20 before the first supporting member 20 and the second supporting member 60 are joined together. In the present embodiment, the second supporting member 60 has the projecting unit 36 projecting toward the direction of the second supporting member 60, and which forms space accepting the moving unit 40, the driving unit 50, and the second terminal 14 between the first supporting member 20 and the second supporting member 60. The projecting unit 36 adheres to the signal electrode 28 by glass filling, etc. Like this, the projecting unit 36 is placed at a portion where to cross the driving electrode 22, and gets close to the driving electrode 22 by glass filling and etc. Not shown, it is desirable that the projecting unit 36 is formed to be laid across 4 lines enclosing the moving unit 40 when it is joined to the second supporting member 60. The first supporting member 20 has the projecting unit 36 formed like this, and thus space enclosing the moving unit 40 of the micro-switch 10 can be sealed definitely by joining the second supporting member 60 to the first supporting member 20.

FIG. 4B is a cross-sectional view of the second supporting member 60 before the first supporting member 20 and the second supporting member 60 are joined together. As shown in FIG. 4A and FIG. 4B, thickness d of the projecting unit 20 in a predetermined direction is smaller than sum of distance L1 from the junction surface 60a of the second supporting member 60 till a surface contacting the pushing terminal 26 of the elastic unit 54b and distance L2 from a surface 20a, where the projecting unit 36 of the first supporting member 20 is installed, till a surface contacting the elastic unit 54b of the pushing terminal 26.

In the present aspect of the present invention, thickness d of the projecting unit 36 is smaller than sum of distance L1 and distance L2, and thus when the first supporting member 20 and the second supporting member 60 are joined together, the pushing terminal 26 pushes down the elastic unit 54b so that the pushing terminal 26 can be brought into contact with the elastic unit 54b definitely.

FIG. 4C is a cross-sectional view of a third substrate 80. In the present embodiment, the third substrate 80 may be a glass substrate. FIG. 4D is a cross-sectional view of the micro-switch 10 in off state after the first supporting member 20 and the second supporting member 60 are joined together. When the first supporting member 20 and the second supporting member 60 are joined together, the pushing terminal 26 installed in the first supporting member 20 pushes down and transforms the elastic unit 54b of the elastic terminal 54 installed on the side of the second supporting member 60 to be brought into contact with the elastic unit 54b.

Like the above, when the first supporting member 20 and the second supporting member 60 are joined together, the elastic terminal 54 and the pushing terminal 26 contact each other, and thus the micro-switch 10 according to the present aspect of the present invention can electrically couple the first supporting member 20 to the second supporting member 60 easily. In addition, the micro-switch 10 according to the present aspect of the present invention can seal space enclosing the moving unit 40 definitely.

FIG. 5 is a cross-sectional view showing the third embodiment of the micro-switch 10 according to the present aspect of the present invention. In the present embodiment, the same symbols as those in FIG. 1 thru FIG. 3 are assigned to the same elements as those in the micro-switch of the first embodiment.

Figure 5A:
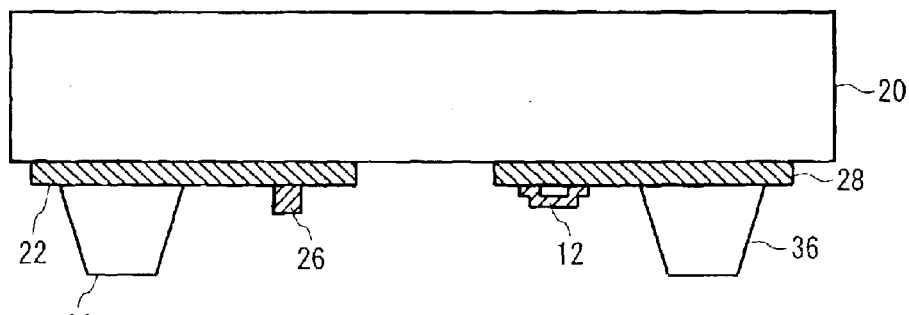
FIGS. 5A through 5D are cross-sectional views showing a micro-switch according to a third embodiment of the present aspect of the present invention.

FIG. 5A is a cross-sectional view of the first supporting member 20 before the first supporting member 20 and the second supporting member 60 are joined together. In the present embodiment, a plurality of pushing terminal 26's are formed in the first supporting member 20. At least one of the pushing terminal 26's is electrically connected to the driving electrode 22. In addition, At least one of the pushing terminal 26's is connected to wiring line of a signal electrode different from the driving electrode 22 which is installed in the first supporting member 20.

Figure 5B:
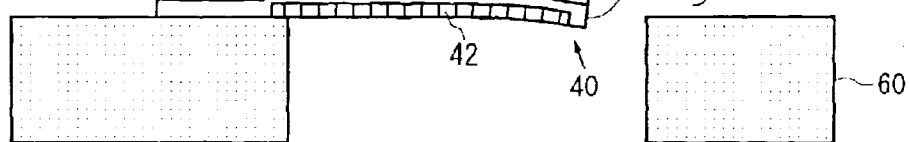
Figure 5C:
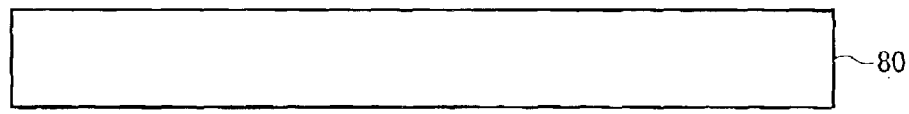

FIG. 5B is cross-sectional view of the second supporting member 60 before the first supporting member 20 and the second supporting member 60 are joined together. In the present embodiment, the moving unit 40 and the driving unit 50 are formed in the second supporting member 60 as in the second embodiment. In addition, a signal track 48 is formed on an upper layer 44a of the second forming member 44 of the moving unit 40. The second terminal 14 is formed on the signal track 48. A plurality of elastic terminal 54's are formed on the upper layer 44a of the moving unit 40. At least one of the elastic terminal 54's is electrically connected to the driving unit 50. The elastic terminal 54 electrically connected to the driving unit 50 contacts the pushing terminal 26 electrically connected to the driving electrode 22. In addition, at least one of a plurality of elastic terminal 54's is electrically connected to the signal track 48. The elastic terminal 54 electrically connected to the signal track 48 contacts the pushing terminal 26 connected to wiring line of a signal electrode different from the driving electrode 22.

Figure 5D:
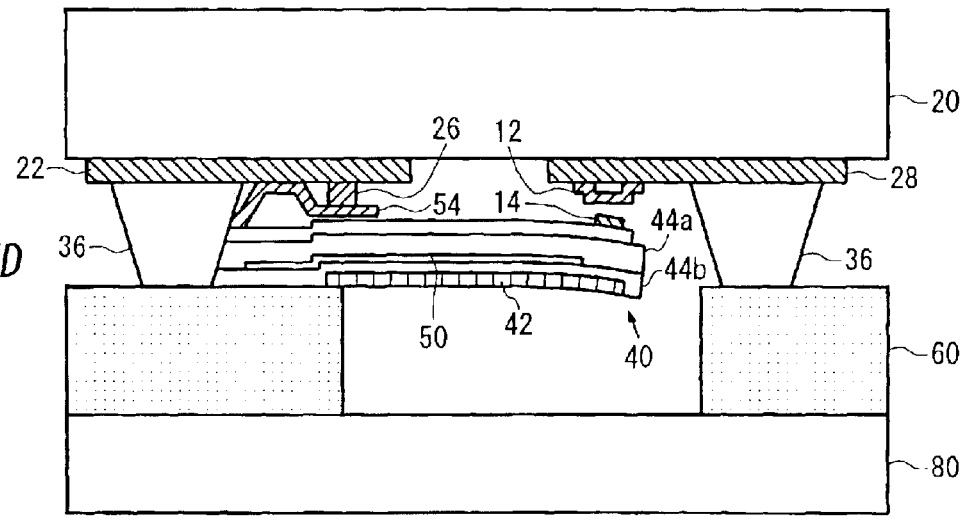

FIG. 5D is a cross-sectional view of the micro-switch 10 in off state after the first supporting member 20, the second supporting member 60, and the third substrate 80 are joined together.

In the present embodiment, if the first supporting member 20 and the second supporting member 60 are joined together, the pushing terminal 26 contacts the elastic terminal 54, pushing down the elastic terminal 54. If the micro-switch 10 is on, the moving unit 50 is driven in the direction of the first supporting member 20. And, the second terminal 14 installed in the moving unit 40 contacts the first terminal 12. At this time, signals are supplied to the first terminal 12 via the signal electrode 28. If the first terminal 12 is coupled to the second terminal 14 electrically, the signals supplied to the first terminal 12 are supplied to the signal track 48 formed on the moving unit 40 via the second terminal 14. The signals supplied to the signal track 48 are supplied to wiring line of a different signal electrode formed in the first supporting member 20 via the elastic terminal 54 connected to the signal track 48 and the pushing terminal 26 connected to the elastic terminal 54.

Like the above, when the first supporting member 20 and the second supporting member 60 are joined together, the elastic terminal 54 and the pushing terminal 26 contacts each other, and thus the micro-switch 10 according to the present aspect of the present invention can electrically couple the first supporting member 20 to the second supporting member 60 easily with low contact resistance.

FIG. 6 is a cross-sectional view showing the forth embodiment of the micro-switch 10 according to the present aspect of the present invention. In the present embodiment, the same symbols as those in FIG. 1 thru FIG. 3 are assigned to the same elements as those in the micro-switch of the first embodiment.

FIG. 6A is a cross-sectional view of the first supporting member 20 before the first supporting member 20 and the second supporting member 60 are joined together. FIG. 6B is a cross-sectional view of the second supporting member 60 before the first supporting member 20 and the second supporting member 60 are joined together. In the present embodiment, the elastic terminal 54 is formed at the opposite end to one end where the second terminal 14 of the moving unit 40 is installed. One end of the elastic terminal 54 is joined to the opposite end of the moving unit 40 so that the opposite end of the elastic terminal 54 has a free end projecting toward the direction of the first supporting member 20. It is desirable that a portion of the second supporting member 60 positioned blew the free end is removed by etching. And, it is desirable that the elastic terminal 54 projects toward the direction of the first supporting member 20, being pushed from the removed portion of the second supporting member 60 toward the direction of the first supporting member of 20. In the present embodiment, the elastic terminal 54 is pushed in the direction of the first supporting member 20 and projects toward the direction of the first supporting member 20, therefore the elastic terminal 54 can be formed easily.

In addition, the free end of the elastic terminal 54 projects toward the direction of the first supporting member 20, and thus the pushing terminal 26 pushes down the elastic terminal 54 when the first supporting member 20 and the second supporting member 60 are joined together. Therefore, the pushing terminal 26 and the elastic terminal 54 contacts each other so that the first supporting member 20 and the second supporting member 60 are electrically connected easily.

FIG. 7 is a cross-sectional view showing the fifth embodiment of the micro-switch 10 according to the present aspect of the present invention. In the present embodiment, the same symbols as those in FIG. 1 thru FIG. 3 are assigned to the same elements as those in the micro-switch of the first embodiment.

FIG. 7A is a cross-sectional view of the first supporting member 20 before the first supporting member 20 and the second supporting member 60 are joined together. FIG. 7B is a cross-sectional view of the second supporting member 60 before the first supporting member 20 and the second supporting member 60 are joined together. In the present embodiment, the elastic terminal 54 further includes a first junction unit 54a joined to the driving unit 50, an elastic unit 54b having elasticity in a predetermined direction, and a second junction unit 54c installed on the first junction unit 54b with putting the elastic unit 54b therebetween.

In the present embodiment, the elastic terminal 54 has a both-side-support structure including the first junction unit 54a and the second junction unit 54b, and thus when the first supporting member 20 and the second supporting member 60 are joined together, elasticity of the elastic terminal 54 can be maintained although the pushing terminal 26 pushes down the elastic unit 54b strongly. Therefore, the elastic terminal 54 and the pushing terminal 26 are in a stable electric contact with each other with low resistance.

FIG. 8 is a cross-sectional view showing process of a manufacturing method of the second embodiment of the micro-switch 10 according to the present aspect of the present invention. There will be explained process forming the pushing terminal 26 in the first supporting member 20 in the following.

First of all, the first substrate 150, the first supporting member 20, shown in FIG. 4 is prepared. In the present embodiment, the first substrate 150 uses glass. It is desirable to use a Pyrex glass (a registered trademark).

Figure 8A:
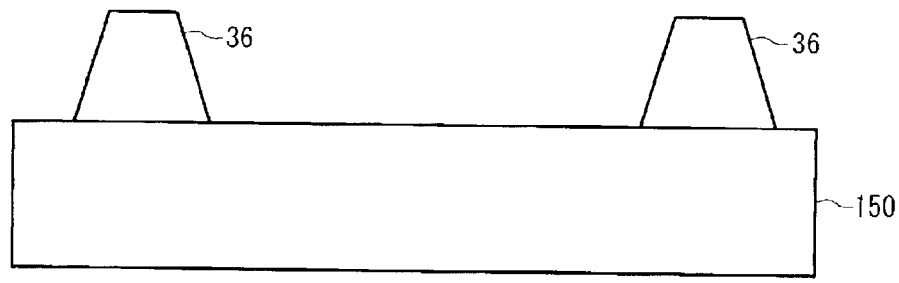
FIGS. 8A, 8B and 8C show cross-sectional views of a micro-switch during a manufacturing process according to the second embodiment of the present aspect of the present invention.

Next, the projecting unit 36 is formed as shown in FIG. 8A. It is desirable thickness of the projecting unit 36 is formed to be smaller than sum of distance from the junction surface 60a of the second supporting member 60 till a surface contacting the pushing terminal 26 of the elastic unit 54b and a distance from surface 20a, where the projecting unit 36 of the first supporting member 20 is installed, till surface contacting the elastic unit 54b of the pushing terminal 26. First of all, the first substrate 150 is coated with photoresist and carried out exposure and development on so that a mask pattern corresponding to the projecting unit 36 is formed. The mask pattern may be formed with an inorganic material, such as silicon nitride layer, polycrystal silicon, and etc. Next, using the mask pattern, for instance, the projecting unit 36 is formed by wet etching using fluoride hydro-acid aqueous solution. It is desirable the first substrate 150 is formed by etching so that the projecting unit 36 has a truncated cone shape.

Figure 8B:
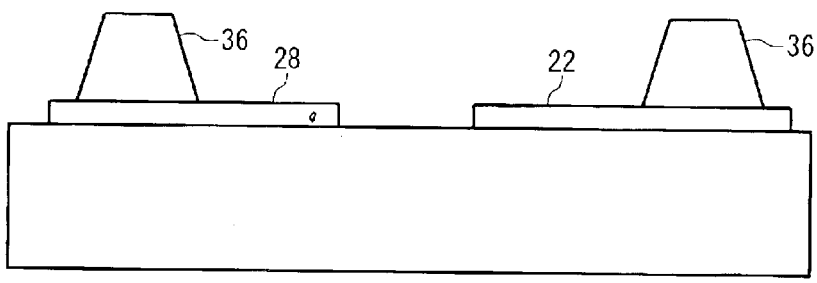

In succession, the driving electrode 22 and the signal electrode 28 are formed as shown in FIG. 8B. In the present embodiment, the driving electrode 22 and the signal electrode 28 are formed with platinum, copper, or etc using lift-off according to photoresist and metal plating. In addition, for instance, titan, chrome, thin film of titan and platinum, or etc may be installed as a contact layer between the driving electrode 22 and the signal electrode 28 and the first substrate 150 in order to improve contact characteristic between the driving electrode 22 and the signal electrode 28 and the first substrate 150. A portion where the driving electrode 22 and the signal electrode 28 and the first substrate 150 cross each other has an airtight structure.

Figure 8C:
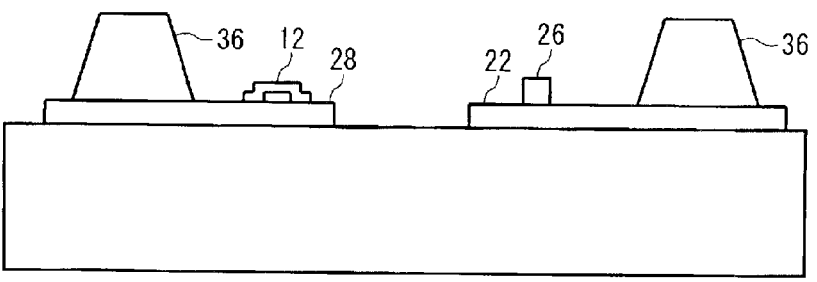

Next, as shown in FIG. 8C, the pushing terminal 26 is formed on the driving electrode 22, and the first terminal 12 and the third terminal are formed on the signal electrode 28, respectively. It is desirable the first terminal 12 and the third terminal have an elastic unit having elasticity in the direction of the second supporting member 60 when the first supporting member 20 and the second supporting member 60 are joined together. It is desirable that for instance, the pushing terminal 26, the first terminal 12, and the third terminal are formed with a metal having high conductivity like platinum, copper, or etc.

FIG. 9 is a cross-sectional view showing another process of a manufacturing method of the second embodiment of the micro-switch 10 according to the present aspect.

Figure 9A:
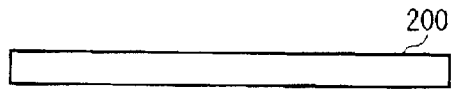
FIGS. 9A through 9O show cross-sectional views of a micro-switch during another manufacturing process according to the second embodiment of the present aspect of the present invention.
Figure 9B:
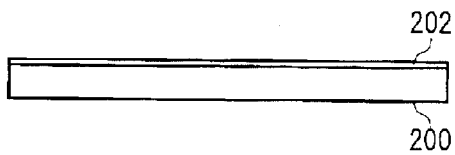

First of all, as shown in FIG. 9A, the second substrate, the second supporting member 60, is prepared. It is desirable the second substrate is a mono-crystal substrate. In the present embodiment, the second substrate uses a mono-crystal substrate. Next, as shown in FIG. 9B, the second substrate 200 is heat-oxidized so that a silicon dioxide layer 202 is formed on the second substrate 200. The silicon dioxide layer 202 may be formed on both sides of the second substrate 200.

Figure 9C:
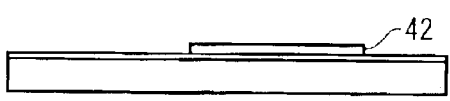

In succession, as shown in FIG. 9C, the first forming member 42 is formed. It is desirable the first forming member 42 is formed with a material having great thermal expansion ratio.

In the present embodiment, the first forming member 42 is formed by the following process. First of all, a material forming the first forming member 42 and having great thermal expansion ratio, such as aluminum, nickel, nickel-steel alloy, or etc is accumulated according to the spattering method and etc. In succession, the accumulated material is coated with photoresist, and a pattern is formed by exposure and development. In succession, photoresist, on which the pattern is formed, is used as a mask, and the exposed accumulated material is removed by using wet etching, dry etching, or etc. Besides, photoresist is removed so that the first forming member 42 is formed on only planed area where the pattern is formed.

In another embodiment, the first forming member 42 may be formed according to the following process. First of all, photoresist is coated, and thus a pattern having an opening in area where the first forming member 42 is formed by exposure and development.

Next, for instance, a material having great thermal expansion ratio, such as aluminum, nickel, nickel-steel alloy, or etc is accumulated according to the plating method or the spattering method. And, as removing photoresist, the first forming member 42 is formed on only the planned area by carrying out lift-off as a process removing only material accumulated on photoresist.

Figure 9D:

Next, as shown in FIG. 9D, a member 44a included in the second forming member 44 (referring to FIG. 4) is formed. It is desirable the member 44a is formed with a material having small thermal expansion ratio. Specifically, it is desirable thermal expansion ratio of the member 44a is smaller than one of the first forming member 42, but is greater than one of member 44b included in the second forming member 44 described in the following. The member 44a may be formed with a material having similar thermal expansion ratio to the member 44b's.

In the present embodiment, member 44a accumulates a material having insulation character, such as silicon dioxide, silicon, silicon nitride, aluminum oxide, or etc by the plasma CVD method or the spattering method.

Figure 9E:

In succession, as shown in FIG. 9E, the driving unit 50 for heating the first forming member 42 and the second forming member 44 is formed. It is desirable the driving unit 50 is formed with a material emitting heat by supplying current. In addition, it is desirable the driving unit 50 is formed with a material having thermal expansion ratio greater than one of a material forming the member 56b but smaller than one of a material forming the first forming member 42.

In the present embodiment, the driving unit 50 is formed with a metal resistance material, such as nickel-chrome alloy, metal laminated layer laminated by chrome and platinum, or etc with using lift-off according to photoresist and the plating method or the spattering method.

Figure 9F:
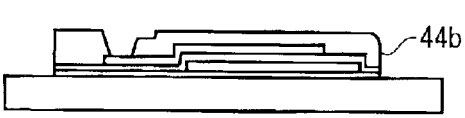

Next, as shown in FIG. 9F, the member 44b included in the second forming member 44 is formed. Specifically, it is desirable the member 44b is formed with a material having smaller thermal expansion ratio than one of the first forming member 42. In the present embodiment, the member 44b accumulates a material having insulation character, such as silicon dioxide, silicon, silicon nitride, aluminum oxide, or etc by the plasma CVD method or the spattering method. At this time, the member 44b is accumulated by that a portion of the driving unit 50 is exposed.

In succession, as removing each portion of the silicon dioxide 202, the member 44a, and the member 44b, a potion of the second substrate 200 is exposed. In the present embodiment, first of all, a planned pattern is formed by exposure and development after coating photoresist. Next, as removing the layer 202 formed by silicon dioxide, the member 44a, and/or the member 44b by using fluoride hydro-acid aqueous solution, the second substrate 200 is exposed.

Figure 9G:
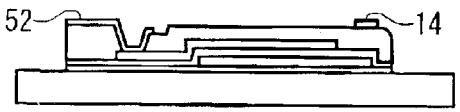

Next, as shown in FIG. 9G, the driving wiring line 52 connected to the second terminal 14 and the driving unit 50.

It is desirable the second terminal 14 and the driving wiring line 52 are formed with a metal having high conductivity. In the present embodiment, the second terminal 14 and the driving wiring line 52 are formed with platinum or copper, using the lift-off method according to photoresist and metal plating. In addition, for instance, titan, chrome, laminated layer of titan and platinum, or etc may be installed as a contact layer between the second terminal 14 and the driving wiring line 52 and the member 44b in order to improve contact characteristic between the second terminal 14 and the driving wiring line 52 and the member 44b.

Figure 9H:
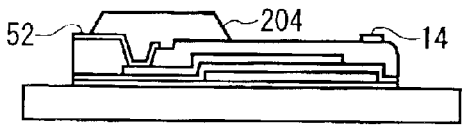

In succession, as shown in FIG. 9H, a fist photoresist layer having a predetermined pattern 204 is formed on the upper layer of the second substrate in order to expose at least a portion of the driving wiring line 52. Preferably, thickness of the first photoresist layer 204 is formed such that sum of distance from the junction surface 60a of the second supporting member 60 till a surface contacting the pushing terminal 26 of the elastic unit 54b and distance from the surface 20a, where the projecting unit is installed, till a surface contacting the elastic unit 54b of the pushing terminal 26 is bigger than thickness of the projecting unit 36 formed in the first supporting member. It is desirable that as adjusting thickness of the first photoresist layer and thickness of the projecting unit 36, when the first supporting member 20 and the second supporting member 60 are joined together, the pushing terminal 26 pushes down the elastic terminal 54 definitely so that the pushing terminal 26 is coupled to the elastic terminal 54 electrically. In addition, it is desirable the first photoresist layer 204 has a trapezoid shape by heating or quadra-tropic etching.

Figure 9I:
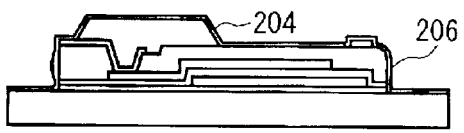

Next, as shown in FIG. 9I, a plating base layer 206 is formed on the upper layer of the second substrate 200 in order to cover a portion of the driving wiring line 52 and the first photoresist layer. The plating base layer 206 is formed with silver, gold-copper alloy, or etc.

Figure 9J:
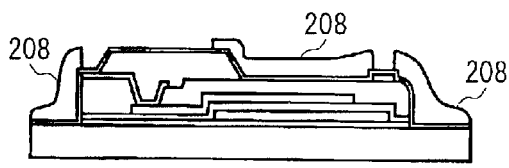

Next, as shown in FIG. 9J, a second photoresist layer 208 is formed in order that the plating base layer 206 formed on a portion of the driving wiring line 52 and the first photoresist layer 204 is exposed. At this time, it is desirable the second photoresist layer 208 is formed such that the plating base layer 206 formed on the second electrode 14 is exposed.

Figure 9K:
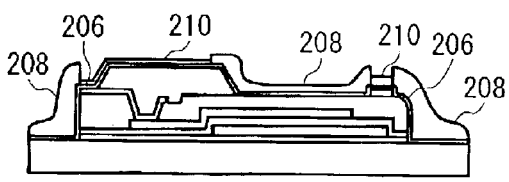
Figure 9L:
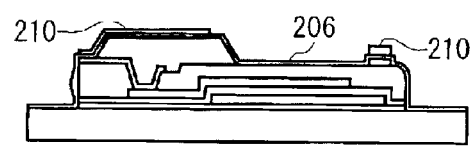
Figure 9M:
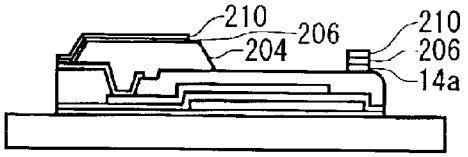
Figure 9N:
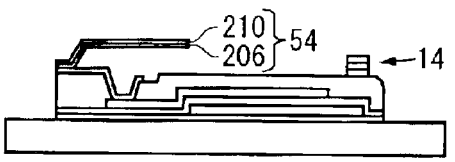

Next, as shown in FIG. 9K, plating layer 210 is formed on a portion where the plating base layer 206 is exposed. Besides, as shown in FIG. 9M, the unnecessary plating base layer 206 is removed. It is desirable the plating base layer 206 is removed by milling, etc. In succession, as shown in FIG. 9N, the first photoresist layer 204 is removed.

Figure 9O:
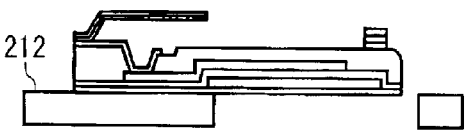

Next, as shown in FIG. 9O, a sustaining unit 212 is formed by removing a portion of the second substrate 200. It is desirable the sustaining unit 212 removes the second substrate 200 by bi-tropic dry etching, forming a pattern corresponding to the sustaining unit 212 by using photoresist and etc.

Then, the first substrate 150 and the second substrate 200 shown in FIG. 8 are joined together in order to correspond the first terminal 12 to the second terminal 14 as soon as the pushing terminal 26 shown in the FIG. 8 contacts the elastic unit, pushing down the elastic unit of the elastic terminal 54 in a determined direction. Besides, the second substrate 200 is joined to the third substrate 80 with the opposite surface to a surface being joined to the first substrate 150 shown in FIG. 8. It is desirable the first substrate 150 and the second substrate 200 are joined together by anode junction. In addition, the pushing terminal 26 and the elastic terminal 54 may be joined together by for instance, soldering or etc when the first substrate 150 and the second substrate 200 are joined together.

Furthermore, in the present embodiment the pushing terminal 26 is formed in the first supporting member 20, the first substrate 200, and the elastic terminal 54 is formed in the second supporting member 60, the second substrate. But, in another embodiment, the elastic terminal 54 may be formed in the first supporting member 20 and the pushing unit 26 may be formed in the second supporting member 60. In addition, in this case, it is desirable the elastic unit is also formed on the second terminal 14.

In addition, a plurality of the driving electrode 14's, the signal electrode 28, the first terminal 12, the third terminal 16, the pushing terminal 26, and etc may be formed in the first substrate 150. In this case, a plurality of the moving unit 40's, the driving unit 50, the second terminal 14, the elastic terminal 54, and etc may be formed in the second substrate 200. And, it is desirable that a separate or integrated micro-switch 10 is formed, dividing the first substrate 150 and the second substrate 200 after the first substrate 150 and the second substrate 200 are joined together.

Besides, the pushing terminal 26 and the elastic terminal 54 explained in the present aspect of the present invention is not limited by micro-switch, but made by micro-machining technique. For instance, a probe pin may be used as a connecting member to electrically connect them to a probe card.

Figure 10:
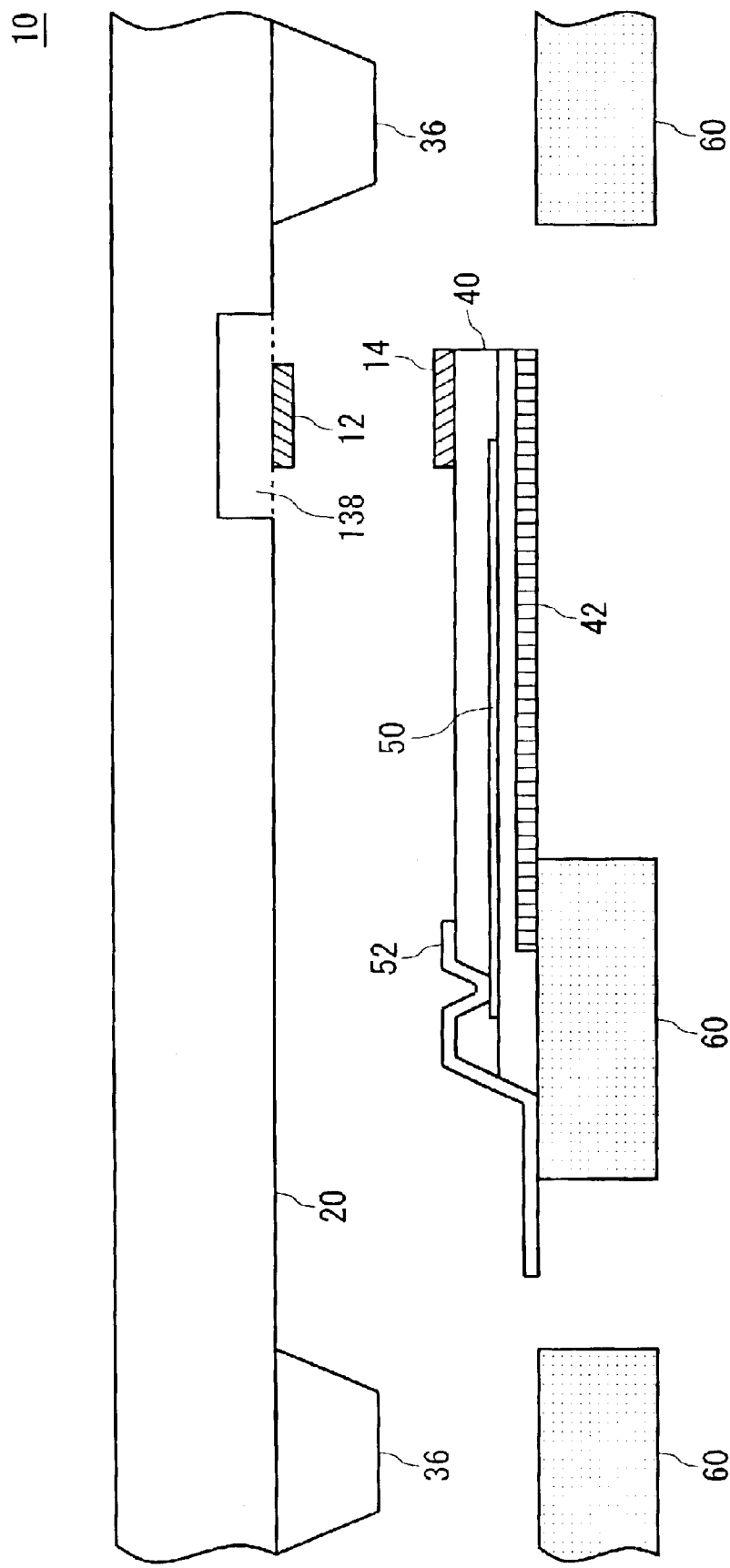
FIG. 10 is a cross-sectional view showing an example of a micro-switch 10 according to the second aspect of the present invention.

FIG. 10 is a cross-sectional view showing an example of the micro-switch 10 according to the second aspect of the present invention. In FIG. 10, the elements assigned with the same symbols as those in FIG. 1 have the same or the same kind of function as that in FIG. 1. In the present aspect of the present invention, the micro-switch 10 is equipped with the first terminal 12, the second terminal 14, the moving unit 40, the first supporting member 20, and the second supporting member 60. The micro-switch 10 is a bimorph-switch for electrically coupling the first terminal 12 to the second terminal 14. The first supporting member 20 is an example of substrates for supporting the first terminal 12. The first supporting member 20 may be a glass substrate. In addition, the first supporting member 20 has accepting unit 138. In case the first terminal 12 is pushed down by the second terminal 14, the accepting unit 138 accepts a portion of the first terminal 12. In the present aspect of the present invention, the accepting unit 138 is a ditch having an opening on a surface of the first supporting member 20 corresponding to the moving unit 40. The accepting unit 138 is formed by etching. In another embodiment, the accepting unit 138 may be formed by machine process.

The second supporting member 60 supports the moving unit 40. The second supporting member 60 supports the opposite end of one end of the moving unit 40 supporting the second terminal 14. The second supporting member 60 may be a silicon substrate.

FIG. 11 is a diagram illustrating working of the micro-switch 10 according to the present aspect of the present invention. In FIG. 11, elements assigned with the same symbols as in FIG. 10 have the same or like function as in FIG. 10.

The driving unit 50 drives the moving unit 40, and electrically couples the second terminal 14 to the first terminal 12. That is, the driving unit 50 drives with adding heat, and thus the moving unit 40 is bent so that the second terminal 14 is coupled to the first terminal 12 electrically. In this case, the second terminal 14 pushes down the first terminal 12.

In the present aspect of the present invention, the first terminal 12 has fixed unit 142 and displacing unit 144. The fixed unit 142 and the displacing unit 144 are formed as one body. The fixed unit 142 is formed in the vicinity of the accepting unit 138 on the surface of the first supporting member corresponding to the moving unit 40. The fixed unit 142 is fixed in the first supporting member 20.

The displacing unit 144 is formed, being extended from the fixed unit 142. The displacing unit 144 is formed, being extended from rim of an opening of the accepting unit 138 to inside of the opening. In case the displacing unit 144 is pushed down by the second terminal 14, it is displaced elastically in the direction of pushing.

FIG. 11A is a diagram showing the micro-switch 10 in case the moving unit 40 keeps and maintains the second terminal 14, not bringing the second terminal 14 into contact with the first terminal 12. In this case, the displacing unit 144 is extended from the fixed unit 142 almost parallel to surface of the moving unit 40. In the present aspect of the present invention, the micro-switch 10 is equipped with a plurality of first terminals 12's.

FIG. 11B is a diagram showing the micro-switch 10 in case the moving unit 40 brings the second terminal 14 into contact with the first terminal 12. The moving unit 40 interconnects electrically each of a plurality of first terminal 12's in order to electrically couple the second terminal 14 to each of a plurality of first terminal 12's. In this case, the displacing unit 144 is transformed in direction the second terminal 14 will push down the first terminal 12 so that the accepting unit 138 accepts tip of the displacing unit 144.

By this, sticking caused by that the second terminal 14 pushes down the first terminal 12 can be prevented. In addition, the second terminal 14 can carry out stable contact to the first terminal 12. According to the present aspect, there can be provided a bimorph-switch having a stable contact point.

FIG. 11C is a diagram showing the micro-switch 10 in case the moving unit 40 keeps and maintains the second terminal 14, not bringing the second terminal 14 into contact with the first terminal 12 according to another example. The first terminal 12 is formed, crossing the opening of the accepting unit 138. In the present example, the first terminal 12 has a plurality of fixed unit 142's corresponding to one end and the other end of the first terminal 12. The displacing unit 144 couples one fixed unit 142 to another fixed unit 142. One end of the displacing unit 144 may be connected to one fixed unit 142, and the other end of the displacing unit 142 may be connected to another fixed unit 142.

In addition, in the present example, the displacing unit 144 includes call gate unit 152 having a call gate structure. The call gate unit 152 may be a pleated shape which can extend/contract in case it is pushed down. The call gate unit 152 may be a beam shape of a call gate shape. In another example, the first terminal 12 may have a call gate structure in the whole displacing unit 144. The first terminal 12 may further have a call gate structure in the whole fixed unit 142.

FIG. 11D is a diagram showing the micro-switch 10 in case the moving unit 40 brings the second terminal 14 into contact with the first terminal 12 according to the present example. In the present example, the displacing unit 144 is transformed in direction the second terminal 14 will push down the first terminal 12 by that the call gate unit 152 extends or contracts. In this case, the accepting unit 138 accepts the center portion of the displacing unit 144.

FIG. 11E is a diagram showing another example of the first terminal 12 according to the present aspect of the present invention. In the present example, the displacing unit includes an extending unit 146 and a contacting unit 148. The extending unit 146 is formed, being extended from the fixed unit 142 almost parallel to the direction in which the second terminal 14 pushes down the first terminal 12. The contacting unit 148 is formed to contact the second terminal 14, being extended from the extending unit 146 almost parallel to a surface of the first supporting member 20 corresponding to the moving unit 40. In this case, the micro-switch 10 has the accepting unit 130 in area enclosed by surface of the first supporting member 20 and the contacting unit 148.

FIG. 11F is a diagram showing another example of the first terminal 12 according to the present aspect of the present invention. In the present example, the contacting unit has a call gate structure in a part. In another embodiment, the contacting unit has a call gate structure in the whole.

FIG. 11G is a diagram showing another example of first terminal 12 according to the present aspect of the present invention. In the present example, the accepting unit 138 is a penetrating hole having an opening on a surface of the first supporting member 20 corresponding to the moving unit 40. In the present example, the accepting unit 138 is formed, penetrating from a surface of the first supporting member 20 to the other surface of it. The first terminal 12 is formed, being extended from in the vicinity of the opening of the penetrating hole to inside of the opening.

FIG. 11H is a diagram showing another example of the first terminal 12 according to the present aspect of the present invention. In the present example, the first terminal 12 is getting thicker in the direction from the fixed unit 142 to the displacing unit 144. In this case, the first terminal 12 is transformed in direction the second terminal 14 will push down the first terminal 12 so that the second terminal 14 can carry out stable contact to the first terminal 12. That is, according to the present aspect, the second terminal 14 can carry out stable contact to the first terminal 12 although the first terminal 12 has a non-uniform thickness.

FIG. 11T is a diagram showing another example of the first terminal 12 according to the present aspect of the present invention. In the present example, the contacting unit 148 is getting thicker in the direction getting far away from the extending unit 146. In this case, the first terminal 12 is transformed in direction the second terminal 14 will push down the first terminal 12 so that the second terminal 14 can carry out stable contact to the first terminal 12.

Although the present invention has been described by way of exemplary embodiments, it should be understood that those skilled in the art might make many changes and substitutions without departing from the spirit and the scope of the present invention which is defined only by the appended claims.

Industrial Applicability

As clarified from the above explanation, according to the present invention, wiring lines among substrates can be electrically coupled in a micro-machine formed by joining a plurality of substrates.

What is claimed is:

1. A micro-switch for electrically coupling a first terminal to a second terminal, comprising:
   a first supporting member where said first terminal is provided;
   a moving unit where said second terminal corresponded to said first terminal is provided;
   a driving unit for bringing said second terminal into contact with said first terminal by driving said moving unit in a direction of said first terminal in response to supply of power;

an electrode provided in said first supporting member for supplying power to said driving unit;

an elastic terminal comprising a first junction unit joined to one of said driving unit and said electrode and an elastic unit having elasticity in a predetermined direction;

a pushing terminal in contact with said elastic terminal by pushing said elastic unit, said pushing unit being electrically joined to the other one of said driving unit and said electrode; and a second supporting member joined to said first supporting member for supporting said driving unit.

2. A micro-switch as claimed in claim 1, wherein said elastic unit is provided to be projecting in a direction to one of said driving unit or said electrode.

3. A micro-switch as claimed in claim 1, wherein said elastic terminal further comprises a second junction unit with said elastic unit arranged between said first and said second junction units.

4. A micro-switch as claimed in claim 1, wherein said moving unit comprises a plurality of members having different thermal expansion ratios.

5. A micro-switch as claimed in claim 1, wherein said driving unit comprises a heater for heating said moving unit.

6. A micro-switch as claimed in claim 1, wherein said first and second supporting members are joined together by an anode junction.

7. A micro-switch as claimed in claim 1, wherein said first and second supporting members are joined together by a metal junction.

8. A micro-switch as claimed in claim 1, wherein said elastic unit is stuck to said pushing terminal.

9. A micro-switch as claimed in claim 1, wherein said first supporting member is formed of a glass substrate and said second supporting member is formed of a silicon substrate.

10. A micro-switch as claimed in claim 1, wherein one of said first and second supporting members comprises a projecting unit projecting toward a direction of the other one of said first and second supporting members, said projecting unit forming a space, where said moving unit and said second terminal are accepted, between said first and second supporting members.

11. A micro-switch as claimed in claim 10, wherein thickness of said projecting unit in said predetermined direction is smaller than a sum of:

a distance from a surface of one of said first and second supporting members, where said projecting unit is provided, to a surface where said pushing terminal is in contact with said elastic unit, or a surface where said elastic unit is in contact with said pushing terminal, and a distance from the other one of said first and second supporting members to a surface where said pushing terminal is in contact with said elastic unit, or a surface where said elastic unit is in contact with said pushing terminal.

12. A micro-switch as claimed in claim 1 further comprising a third terminal corresponding to said second terminal, wherein said second terminal couples electrically said first terminal to said third terminal by being in contact with said first terminal and said third terminal.

13. A micro-switch as claimed in claim 1 comprises a plurality of said elastic terminals and a plurality of said pushing terminals respectively corresponding to said plurality of said elastic terminals.

14. A micro-switch as claimed in claim 1 further comprising a power source for supplying power to said driving unit, wherein said first supporting member has a penetrating hole penetrating from a junction surface joined to said second supporting member to an opposite surface to said junction surface; and said electrode comprises a conductive member for filling in said penetrating hole and couples electrically said power source to said driving unit via said conductive member.

15. A micro-switch as claimed in claim 1, wherein said first terminal comprises a fixed unit fixed to said first supporting member and a facing unit formed by being extended from said fixed unit, said facing unit facing to said first supporting member with an air gap therebetween.

16. A micro-switch as claimed in claim 1, wherein said pushing terminal pushes the elastic terminal when said first supporting member and second supporting member are attached with each other.

17. A micro-switch for electrically coupling a first terminal to a second terminal, comprising:

a first supporting member where said first terminal is provided; and a moving unit where said second terminal corresponding to said first terminal is provided, wherein said first terminal comprises:

a fixed unit fixed to said first supporting member;

a displacing unit formed by being extended from said fixed unit, said displacing unit being displaced elastically in a direction of push when said displacing unit is pushed by said second terminal.

18. A micro-switch as claimed in claim 17, wherein said first supporting member has a ditch having an opening on a surface corresponding to said moving unit;

said fixed unit is formed in the vicinity of said ditch on a surface corresponding to said moving unit of said first supporting member; and said displacing unit is formed by being extended from rim of said opening of said ditch to inside of said opening.

19. A micro-switch as claimed in claim 17, wherein said first supporting member has a penetrating hole having an opening at a surface corresponding to said moving unit;

said fixed unit is formed in the vicinity of said penetrating hole on a surface corresponding to said moving unit; and said displacing unit is formed by being extended from rim of said opening of said penetrating unit to inside of said opening.

20. A micro-switch as claimed in claim 17, wherein said displacing unit comprises:

an extending unit provided by being extended from said fixed unit in a direction almost parallel to said pushing direction;

a contacting unit formed by being extended from said extending unit in a direction almost parallel to a surface corresponding to a bimorph unit of said first supporting member, said contact unit being in contact with said second contacting point.

21. A micro-switch as claimed in claim 17, wherein said displacing unit comprises a call gate unit having a call gate structure.

* * * * *

UNITED STATES PATENT AND TRADEMARK OFFICE
CERTIFICATE OF CORRECTION

PATENT NO. : 6,903,637 B2
APPLICATION NO. : 10/329636
DATED : June 7, 2005
INVENTOR(S) : Masaru Miyazaki et al.

It is certified that error appears in the above-identified patent and that said Letters Patent is hereby corrected as shown below:

On the title page of the patent, under item (73), Assignee, add the following

Assignee: Masayoshi Esashi, Miyagi (JP)

Signed and Sealed this

Seventh Day of August, 2007

JON W. DUDAS
*Director of the United States Patent and Trademark Office*